US012422906B2

(12) United States Patent
Hampton et al.

(10) Patent No.: US 12,422,906 B2
(45) Date of Patent: Sep. 23, 2025

(54) AUTOMATED THERMAL PROPERTY ASSIGNMENT BASED ON SURROUNDING PART SUBSTRATE

(71) Applicant: Dell Products L.P., Round Rock, TX (US)

(72) Inventors: Patrick A. Hampton, Round Rock, TX (US); Ernesto Ramirez, Austin, TX (US); Bo Hom, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 1044 days.

(21) Appl. No.: 17/184,637

(22) Filed: Feb. 25, 2021

(65) Prior Publication Data

US 2022/0269321 A1 Aug. 25, 2022

(51) Int. Cl.
  *G06F 1/20* (2006.01)
  *H05K 1/18* (2006.01)
  *H05K 7/20* (2006.01)

(52) U.S. Cl.
  CPC ......... *G06F 1/203* (2013.01); *H05K 7/20172* (2013.01); *H05K 7/20209* (2013.01); *H05K 1/181* (2013.01)

(58) Field of Classification Search
  CPC ............... H05K 7/20209; H05K 1/181; H05K 1/20172; G06F 1/1616; G06F 1/1681; G06F 1/203
  See application file for complete search history.

(56) References Cited

U.S. PATENT DOCUMENTS

| | | | |
|---|---|---|---|
| 2003/0227756 A1* | 12/2003 | Abe | H03F 3/343 361/748 |
| 2004/0003301 A1* | 1/2004 | Nguyen | G06F 1/206 713/300 |
| 2004/0128101 A1* | 7/2004 | Hermerding, II | G01K 7/42 374/E7.042 |
| 2006/0037334 A1* | 2/2006 | Tien | G06F 1/206 257/E23.099 |
| 2008/0066022 A1* | 3/2008 | Chandra | G06F 30/36 716/111 |
| 2008/0218969 A1* | 9/2008 | Muraki | G06F 1/206 361/688 |
| 2009/0256512 A1* | 10/2009 | Begun | H05K 7/20209 318/471 |

(Continued)

*Primary Examiner* — Timothy J Thompson
*Assistant Examiner* — Rhadames Alonzo Miller
(74) *Attorney, Agent, or Firm* — Terrile, Cannatti & Chambers, LLP; Stephen A. Terrile

(57) ABSTRACT

A portable information handing system. The portable information handling system includes a main housing portion, the main housing portion comprising first enclosure portion, a second enclosure portion, a motherboard, an electrical path detection component and a thermal characteristic selection system, the electrical path detection component being physically coupled between one of the first enclosure portion and the second enclosure portion and the motherboard, the thermal characteristic selection system determining a material of the one of the first enclosure portion and the second enclosure portion, the thermal characteristic selection system adjusting a thermal design power value based upon the material and a lid housing portion, the display chassis portion comprising a display component and a rear display cover portion.

22 Claims, 8 Drawing Sheets

(56) References Cited

U.S. PATENT DOCUMENTS

| | | | |
|---|---|---|---|
| 2010/0283539 A1* | 11/2010 | Yanagisawa | G01R 19/2503 330/127 |
| 2013/0159755 A1* | 6/2013 | Presant | G06F 1/324 713/340 |
| 2015/0016059 A1* | 1/2015 | Esmaily | H05K 7/20145 361/695 |
| 2015/0346798 A1* | 12/2015 | Dongara | G06F 1/206 713/320 |
| 2016/0091938 A1* | 3/2016 | Edwards | G06F 1/3215 700/300 |
| 2017/0030364 A1* | 2/2017 | Young | G06F 1/206 |
| 2017/0179708 A1* | 6/2017 | Frye | G01K 7/00 |
| 2017/0285700 A1* | 10/2017 | Cartagena | G06F 1/206 |
| 2018/0249600 A1* | 8/2018 | Coppola | H05K 9/0081 |
| 2019/0043779 A1* | 2/2019 | Chung | H05K 1/0203 |
| 2020/0080902 A1* | 3/2020 | Tan | G06F 1/324 |
| 2021/0165051 A1* | 6/2021 | Doyle | G01K 15/007 |
| 2021/0278885 A1* | 9/2021 | Sabotta | H05K 7/20154 |
| 2022/0030745 A1* | 1/2022 | Embleton | H05K 7/20145 |
| 2022/0231718 A1* | 7/2022 | Stewart | H05K 7/20136 |
| 2022/0326759 A1* | 10/2022 | Wang | G06F 1/206 |

\* cited by examiner

FIG. 7

| | CHASSIS MATERIAL | TDP | THERMAL TABLE |
|---|---|---|---|
| PRODUCT 1 | METAL | 15w | #1 |
| | PLASTIC | 17.5w | #2 |
| PRODUCT 2 | METAL | 16.5w | #3 |
| | PLASTIC | 17.5w | #4 |

FIG. 8

| | PRODUCT 1 | | PRODUCT 2 | | PRODUCT 3 | |
|---|---|---|---|---|---|---|
| 180/360 | 180 | 360 | 180 | 360 | 360 | 180 | 180 |
| MATERIAL | Al | PLASTIC | AL | PLASTIC | AL | PLASTIC | PLASTIC | AL |
| FEET HEIGHT | 2.05 | 2.05 | 2.50 | 2.05 | 2.05 | 2.50 | 2.05 | 2.05 |
| TDP | 15w | 17.5w | 17.5w | 16.5w | 17.5w | 17.5w | 17.5w | 17.5w |
| SOLUTION | X | v | v | X | v | v | v | v |

AUTOMATED THERMAL PROPERTY ASSIGNMENT BASED ON SURROUNDING PART SUBSTRATE

BACKGROUND OF THE INVENTION

Field of the Invention

The present invention relates to information handling systems. More specifically, embodiments of the invention relate to automated thermal property assignment based on surrounding part substrate in a portable information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

In one embodiment the invention relates to a portable information handing system, comprising: a main housing portion, the main housing portion comprising first enclosure portion, a second enclosure portion, a motherboard, an electrical path detection component and a thermal characteristic selection system, the electrical path detection component being physically coupled between one of the first enclosure portion and the second enclosure portion and the motherboard, the thermal characteristic selection system determining a material of the one of the first enclosure portion and the second enclosure portion, the thermal characteristic selection system adjusting a thermal design power value based upon the material; and, a lid housing portion, the display chassis portion comprising a display component and a rear display cover portion.

In another embodiment the invention relates to an information handling system comprising: a base chassis, the base chassis comprising first enclosure portion, a second enclosure portion, a motherboard, an electrical path detection component and a thermal characteristic selection system, the electrical path detection component being physically coupled between one of the first enclosure portion and the second enclosure portion and the motherboard, the thermal characteristic selection system determining a material of the one of the first enclosure portion and the second enclosure portion, the thermal characteristic selection system adjusting a thermal design power value based upon the material; and, a display chassis, the display chassis comprising a display component and a rear display cover portion.

In another embodiment the invention relates to a method for adjusting thermal characteristics of an information handling system, comprising: identifying a material type of at least one enclosure of the information handling system during operation of the information handling system, the material type comprising a conductive material type and a non-conductive material type; and, adjusting a thermal design power value based upon the material type.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 7 shows a table of example thermal characteristic selections for automated thermal property assignment based on surrounding part substrate.

FIG. 8 shows a table of example thermal characteristic selections for automated thermal property assignment based on surrounding part substrate material as well as additional system variables.

DETAILED DESCRIPTION

Figure 1:
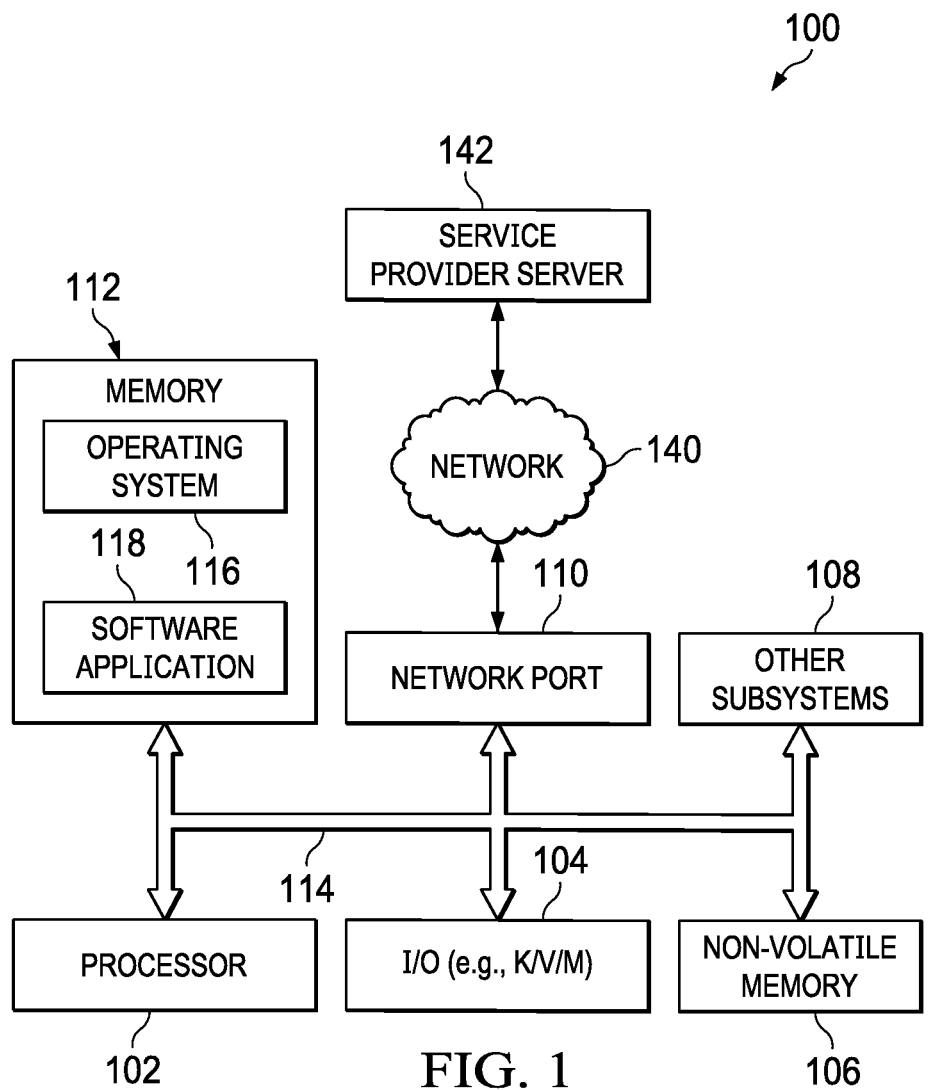
FIG. 1 shows a general illustration of components of an information handling system as implemented in the system and method of the present invention.

Various aspects of the disclosure include an appreciation that information handling systems with multi-configuration stock keeping units (SKUs) that include mixed enclosure substrate material are often forced to assume worst case thermal skin limits for the works case material. Various aspects of the present disclosure include an appreciation that enclosures where some or all of the enclosure includes a metal substrate can require lower thermal skin temperature limits as compared to plastic enclosures. For products that have multiple SKUs with mixed color, material, finishes (CMF) combinations, all of the product SKUs are often forced to assume the worst-case scenario for skin temperature allowances. As a result, the product SKUs that could have a higher skin temperature allowance are limited in overall performance as the thermal characteristics are limited by the assumption of the worst-case SKU temperature limit. For example, product SKUs that are plastic only are configured with temperature characteristics which are limited to the temperature characteristics of corresponding product SKUs for enclosures where some or all of the enclosure includes a metal substrate.

Accordingly, a system and method are disclosed for providing dynamic adjustment of thermal characteristics based on a plurality of CMF configurations. In various embodiments, the dynamic adjustment automatically adjusts a thermal design power (TDP) value based upon surrounding CMF skin requirements of the particular CMF configuration. In certain embodiments, the TDP value corresponds to a particular thermal wattage that can be associated with the information handling system. In certain embodiments, the TDP value provides an indication of thermal functions that can be adjusted based upon the thermal value. In certain embodiments, the thermal functions can include one or more of an increase/decrease of fan power and an increase/decrease of fan speed. Such a dynamic adjustment enables higher TDP values on plastic substrates as the plastic substrates have a corresponding higher skin temperature allowance as well as lower TDP values on systems which include metal surfaces as the metal surfaces have a corresponding lower skin temperature allowance. Such a dynamic adjustment allows the thermal characteristics to be adjusted if a user changes some or all of the CMF substrates of the product. In various embodiments, the dynamic adjustment can be provided to the information handling system as a low cost flexible solution. In various embodiments, the dynamic adjustment is provided via an electrical path detection component. In various embodiments, the electrical path detection component includes a spring claim. In various embodiments, the spring clip provides placement flexibility to enable detection of more than one CMF substrate on any open area of a printed circuit board substrate.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise at least one software application 118. In one embodiment, the information handling system 100 is able to download the software application from the service provider server 142. In another embodiment, the software application 118 is provided as a service from the service provider server 142.

Figure 2:
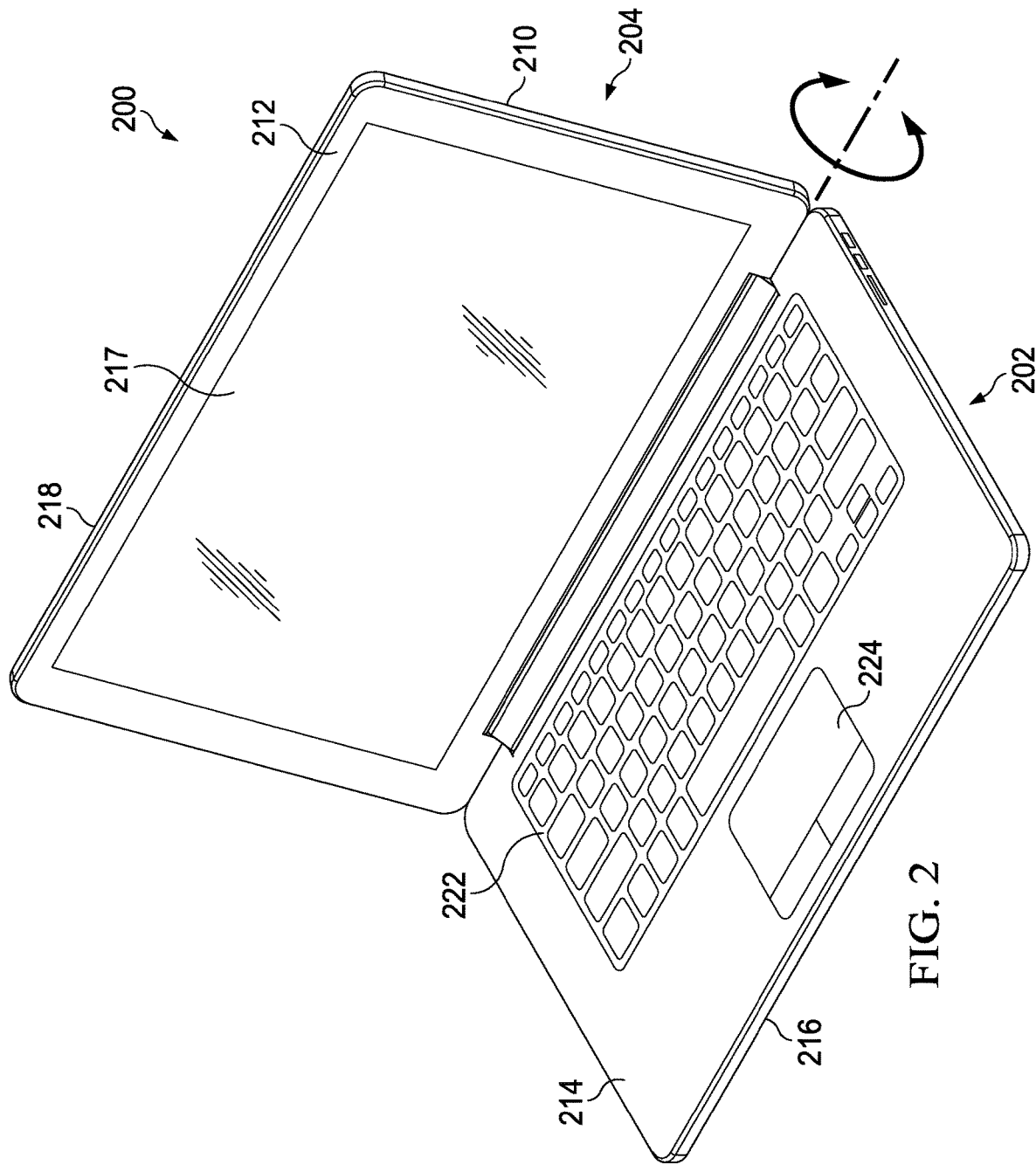
FIG. 2 shows a perspective view of an example portable information handling system.

FIG. 2 shows a perspective view of an example portable information handling system chassis 200 such as a tablet type portable information handling system, a laptop type portable information handling system, or any other mobile information handling system. It will be appreciated that some or all of the components of the information handling system 100 may be included within information handling system chassis 200. The portable information handling system 200 chassis includes a base chassis 202 and a display chassis 204 shown in an open configuration. It will be appreciated that a closed configuration would have the display chassis 204 fully closed onto the base chassis 202.

The base chassis 202 or the display chassis 204 of the information handling system 200 may comprise an outer metal case or shell. The information handling system 200 may include a plurality of chassis portions. In various embodiments, the information handling system 200 may include some or all of an A-Cover 210, a B-Cover 212, a C-cover 214 and a D-Cover 216. In various embodiments, the A-Cover 210 and the B-Cover 212 provide the display chassis 204. In various embodiments, the C-Cover 214 and the D-Cover 216 provide the base chassis 202.

In various embodiments, the A-cover 210 encloses a portion of the display chassis 204 of the information handling system 200. In various embodiments, the B-cover 212 encloses another portion of the display chassis 204 of the information handling system 200. In various embodiments, the B-Cover may include a display screen 217 and a bezel 218 around the display screen.

In various embodiments, the C-cover 214 encloses a portion of the base chassis 202 of the information handling system 200. In various embodiments, the C-cover 214 may include, for example, a keyboard 222, a trackpad 224, or other input/output (I/O) device as well as an enclosure portion. In certain embodiments the enclosure portion includes a palmrest component. In certain embodiments, the substrate of the enclosure portion may be composed of one of a plurality of materials. In certain embodiments, the plurality of materials includes a plastic material, a carbon fiber material and a metal material. In certain embodiments, the carbon fiber material has substantially the same conductive properties as the plastic material. In certain embodiments, the metal material is aluminum. In various embodiments, certain components of the information handling system such as a mother board are mounted within the C-Cover 214. In various embodiments, the D-cover 216 encloses another portion of the base chassis 202 of the information handling system 200.

When placed in the closed configuration, the A-cover 210 forms a top outer protective shell, or a portion of a lid, for the information handling system 200, while the D-cover 216 forms a bottom outer protective shell, or a portion of a base, for the information handling system. When in the fully closed configuration, the base chassis 202 and the display chassis 204 would be substantially parallel to one another.

In some embodiments, both the A-cover 210 and the D-cover 216 may be comprised entirely of metal. In some embodiments, the base chassis 202 and display chassis 204 may include both metallic and plastic components. For example, plastic components that are radio-frequency (RF) transparent may be used to form a portion of the C-cover 214.

In various embodiments, the base chassis 202 may be movably connected to a back edge of the display chassis 204 via one or more hinges. In this configuration, the hinges allow the display chassis 204 to rotate from and to the base chassis 202 allowing for multiple orientations of the information handling system 200. In various embodiments, the information handling system may include a sensor to detect the orientation of the information handling system and activate or deactivate any number of antenna systems based on the occurrence of any specific orientation. In some embodiments, the information handling system may be a laptop with limited rotation of the display chassis 204 with regard to the base chassis 202, for example up to 180° rotation arc. In other embodiments the information handling system 200 may be a convertible information handling system with full rotation to a tablet configuration. It will be appreciated that in various embodiments, the A-Cover or the B-Cover could attach to the C-Cover or the D-Cover.

Figure 3:
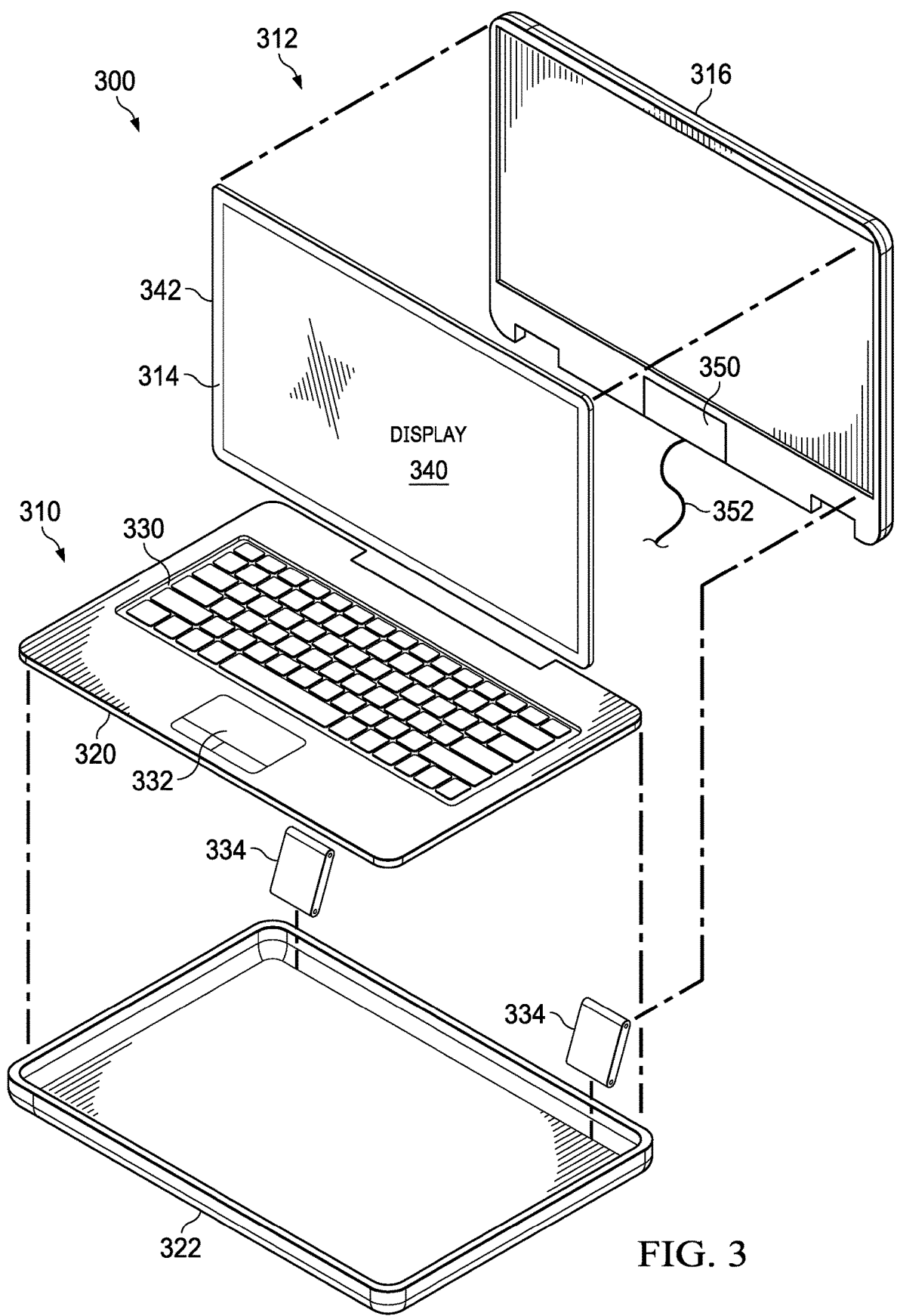
FIG. 3 shows a blown-up view of a portable information handling system.

FIG. 3 shows a blown-up view of a portable information handling system 300 having rotationally-coupled housing portions. In the example embodiment, a main housing portion 310 (which corresponds to a base chassis 202) rotationally couples to a lid housing portion 312 (which corresponds to a display chassis 204) to support various configurations to interact with an end user. Main housing portion 310 may hold one or more components of the portable information handling system, including but not limited to processor 102, system bus 114, memory subsystem 112, I/O subsystem 104 and network interface 110 discussed with respect to FIG. 1. Main housing portion 310 includes a top cover portion 320 (which includes the C-Cover 214) and a bottom cover portion 322 (which includes the D-Cover 216). Lid housing portion 312 includes a display cover portion 314 (which includes the B-Cover 210) and a rear display cover portion 316 (which includes the A-Cover 212). The top cover portion 320 may include an integrated keyboard 330 or other I/O devices, such as a trackpad 332 or microphone (not shown).

Lid housing portion 312 is rotationally coupled to main housing portion 310 via at least one hinge assembly 334. Lid housing portion 212 includes display 340 that visually presents information to the user as well as a bezel 342. Display 340 may be a touch panel with circuitry enabling touch functionality in conjunction with a display. In some embodiments, display 340 may be an "infinity edge" or "narrow bezel" display that approaches one or more the edges of lid housing portion 212 such that bezel may be narrow in size (e. g., less than 10 millimeters) on the edges. For example, display 340 is an infinity display with narrow bezels on the top and sides of lid housing portion 212 in the embodiment shown in FIG. 3. In certain embodiments, the side bezel is less than 4 mm (+/−10%) and the top bezel is less than 6 mm (+/−10%).

Lid housing portion 212 may also include timing controller (TCON) 350. Hinge assembly 330 may include cable 352 for communicably coupling one or more components within main housing portion 310 to one or more components within lid housing portion 312. For example, cable 352 may provide communication of graphics information from an I/O subsystem to TCON 350 for generation of visual images for display on display 340. Although a single cable 352 is shown, portable information handling system 300 may include one or more additional cables 352 for communicating components disposed in main housing portion 310 and lid housing portion 312. Placement of cable 352 may be selected based on design considerations, materials or manufacturing cost, material reliability, antenna placement, as well as any other considerations.

Hinge assembly 334 allows main housing portion 310 and lid housing portion 312 to rotate between a plurality of positions. For example, when portable information handling system 300 is not in use, lid housing portion 312 may be closed over the top of main portion 310 such that display 340 and keyboard 330 are protected from unintended use or damage. Rotation of lid housing portion 312 by approximately 90 degrees from main housing portion 310 brings display 340 in a raised "clamshell" position relative to keyboard 330 so that an end user can make inputs to keyboard 330 or touch panel portion of display 340 while viewing display 340. In some embodiments, clamshell position may represent lid housing portion 212 open between approximately 1 and 180 degrees from main housing portion 310. Rotation of lid housing portion 312 between approximately 180 and 359 degrees from main housing portion 310 may place portable information handling system 300 in "tablet stand" and/or "tent" positions. In tablet stand and tent positions, the user may make inputs via touch panel portion of display 340 while viewing display 340. A full 360 degree rotation of main housing portion 310 relative to lid housing portion 312 provides a tablet configuration having display 340 exposed to accept touch inputs. In any position, user inputs may be communicated to an I/O subsystem or a processor of the portable information handling system 300 for processing, and then updated information may be communicated back via cable 352 to display 340 for displaying to the user. Hinge assembly 334 may be comprised of one or more discrete hinges or a unified assembly of hinges.

Figure 4:
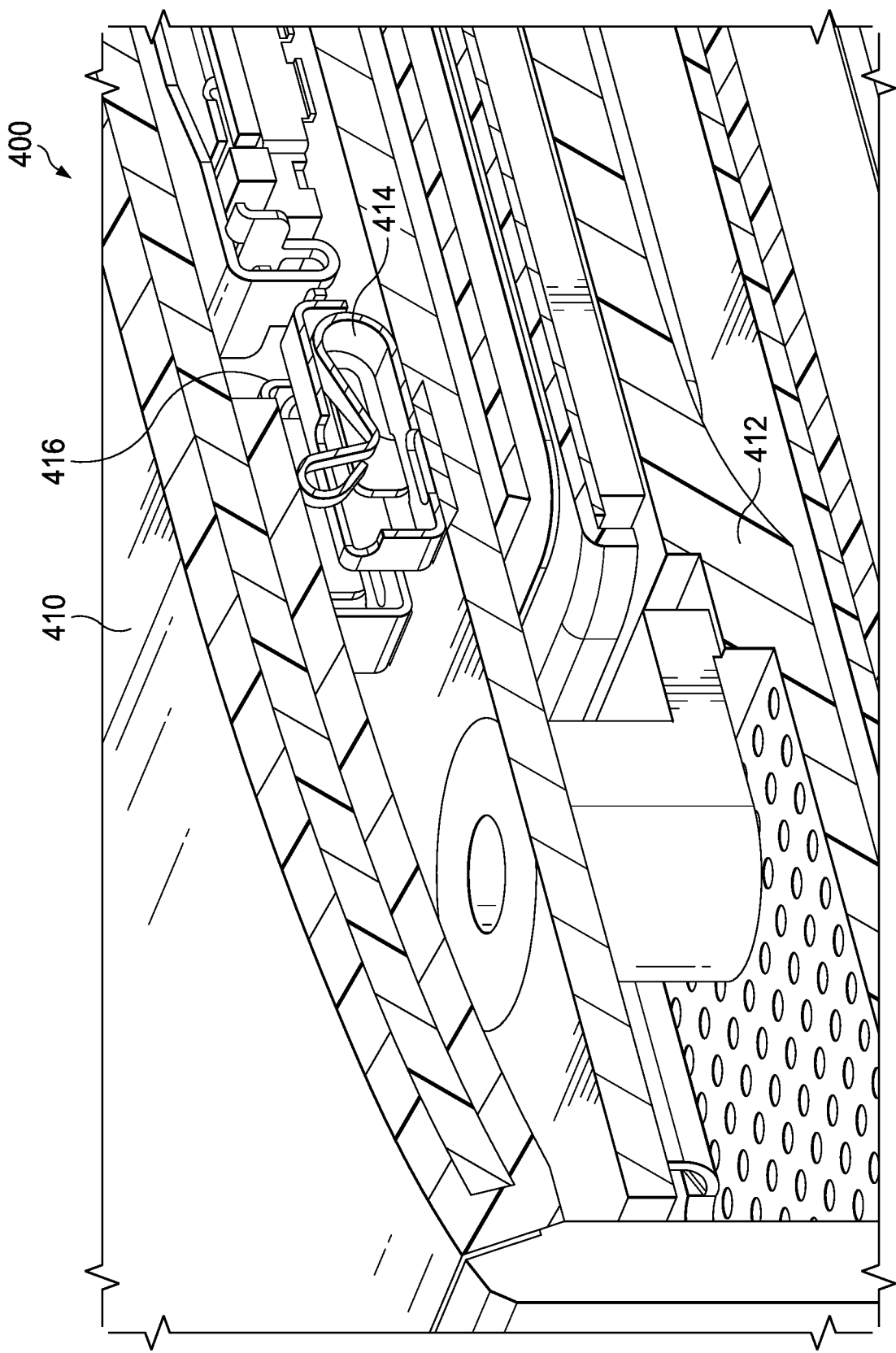
FIG. 4 shows a cutaway perspective view of a base chassis of a portable information handling system.

FIG. 4 shows a cutaway perspective view of a base chassis 400 (i.e., a main housing portion) of a portable information handling system. In various embodiments, the base chassis 400 includes a first enclosure portion 410, a second enclosure portion 412, a printed circuit board 414 and a spring clip 416. In certain embodiments, the first enclosure portion 410 corresponds to the D-cover of the information handling system. In certain embodiments, the second enclosure portion 412 corresponds to some or all of the C-cover of the information handling system. In certain embodiments, the second enclosure 412 corresponds to a palmrest portion of the C-cover. In various embodiments, one or both of the first enclosure portion 410 and the second enclosure portion 412 can be configured with various combinations of CMF configurations.

The spring clip 416 is one example of an electrical path detection component in that it provides an electrical path from an enclosure portion which is conductive to the printed circuit board 414. By detecting this path, a dynamic thermal adjustment system can determine whether the enclosure is conductive or non-conductive. Based upon this determination, the dynamic thermal adjustment system can dynamically configure thermal characteristics of the information handling system in which the base portion 400 is located.

Accordingly, the dynamic thermal adjustment system provides dynamic adjustment of thermal characteristics based on a plurality of CMF configurations. In various embodiments, the dynamic adjustment automatically adjusts a thermal design power (TDP) value based upon surrounding CMF skin requirements of the particular CMF configuration. In certain embodiments, the TDP value corresponds to a particular thermal wattage that can be associated with the information handling system. In certain embodiments, the TDP value provides an indication of thermal functions that can be adjusted based upon the thermal value. In certain embodiments, the thermal functions can include one or more of an increase/decrease of fan power and an increase/decrease of fan speed. Such a dynamic adjustment enables higher TDP values on plastic substrates as the plastic substrates have a corresponding higher skin temperature allowance as well as lower TDP values on systems which include metal surfaces as the metal surfaces have a corresponding lower skin temperature allowance. Such a dynamic adjustment allows the thermal characteristics to be adjusted if a user changes some or all of the CMF substrates of the product. In various embodiments, the dynamic adjustment can be provided to the information handling system as a low cost flexible solution. In various embodiments, the dynamic adjustment is provided via an electrical path detection component. In various embodiments, the electrical path detection component includes a spring claim. In various embodiments, the spring clip provides placement flexibility to enable detection of more than one CMF substrate on any open area of a printed circuit board substrate.

Figure 5:
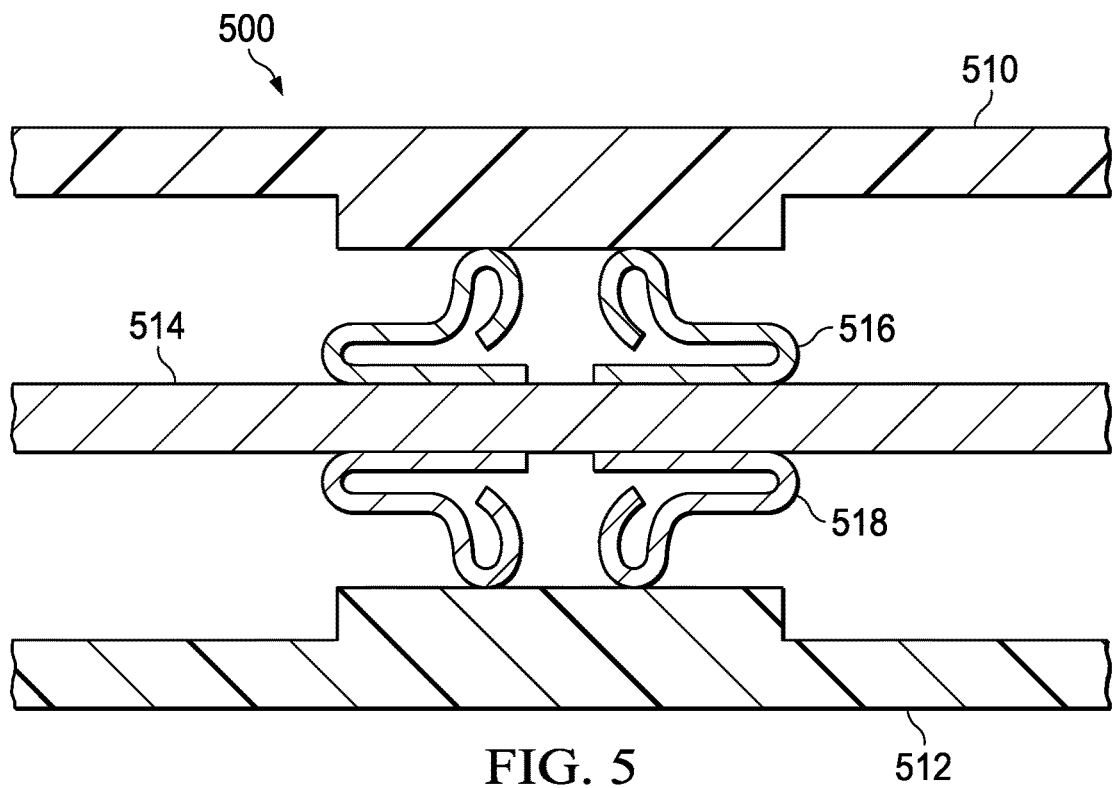
FIG. 5 shows a cross sectional view of a portion of a base chassis of a portable information handling system.

FIG. 5 shows a cross sectional view of a portion of a base chassis 500 of a portable information handling system. In various embodiments, the base chassis 500 includes a first enclosure portion 510, a second enclosure portion 512, a printed circuit board 514 and a first spring clip 516 and a second spring clip 518. In certain embodiments, the first enclosure portion 510 corresponds to the D-cover of the information handling system. In certain embodiments, the second enclosure portion 512 corresponds to some or all of the C-cover of the information handling system. In certain embodiments, the second enclosure 512 corresponds to a palmrest portion of the C-cover. In various embodiments, one or both of the first enclosure portion 510 and the second enclosure portion 512 can be configured with various combinations of CMF configurations.

The spring clips 516, 518 are examples of an electrical path detection component in that it provides an electrical path from an enclosure portion which is conductive to the printed circuit board 514. By detecting whether each of these paths are conductive, a dynamic thermal adjustment system can determine whether the enclosure is conductive or non-conductive. For the configuration shown in FIG. 5, the first enclosure portion 510 and the second enclosure portion 512 are plastic and accordingly, there is not an electrical conductivity path between either the first enclosure portion 510 or the second enclosure portion 610 and the printed circuit board 614. Based upon this determination, the dynamic thermal adjustment system can dynamically configure thermal characteristics of the information handling system in which the base portion 500 is located.

Figure 6:
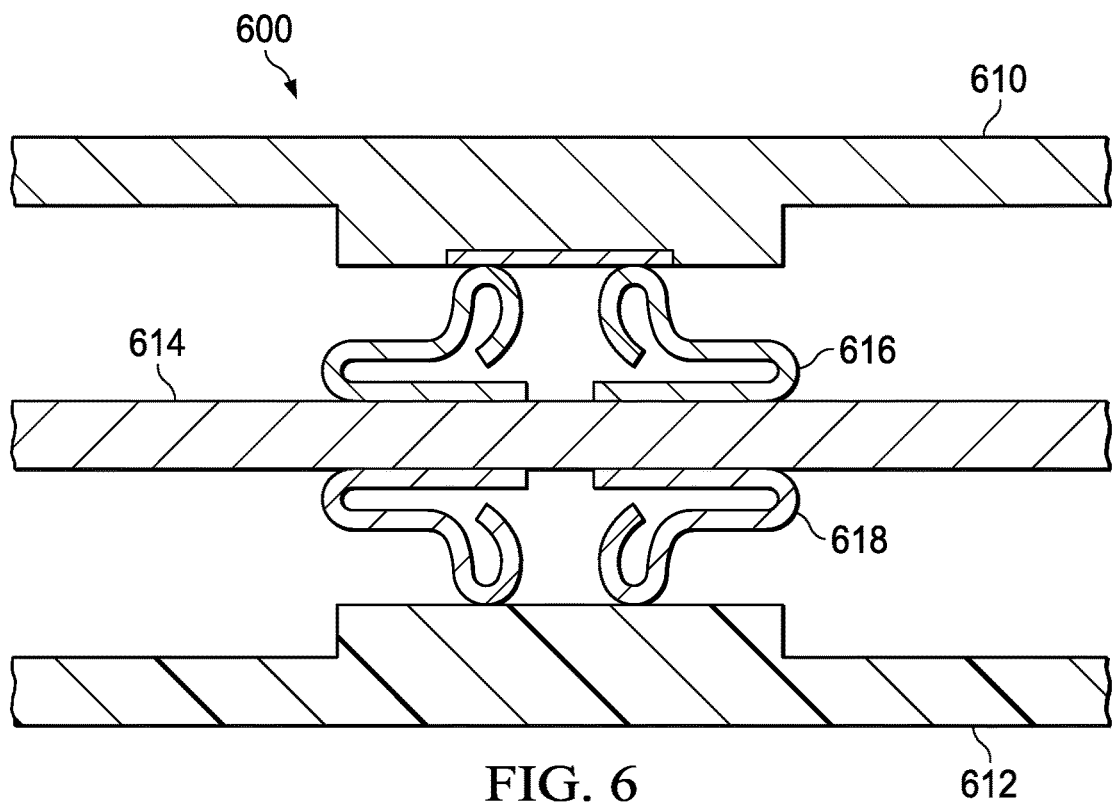
FIG. 6 shows a cross sectional view of a portion of a base chassis of a portable information handling system.

FIG. 6 shows a cross sectional view of a portion of a base chassis of a portable information handling system. In various embodiments, the base chassis 600 includes a first enclosure portion 610, a second enclosure portion 612, a printed circuit board 614 and a spring clip 616. In certain embodiments, the first enclosure portion 610 corresponds to the D-cover of the information handling system. In certain embodiments, the second enclosure portion 612 corresponds to some or all of the C-cover of the information handling system. In certain embodiments, the second enclosure 612 corresponds to a palmrest portion of the C-cover. In various embodiments, one or both of the first enclosure portion 610 and the second enclosure portion 612 can be configured with various combinations of CMF configurations.

The spring clips 616, 618 are examples of an electrical path detection component in that it provides an electrical path from an enclosure portion which is conductive to the printed circuit board 614. By detecting whether each of these paths are conductive, a dynamic thermal adjustment system can determine whether the enclosure is conductive or non-conductive. For the configuration shown in FIG. 6, the second enclosure portion 612 is metal and accordingly, there is an electrical conductivity path 620 between the second enclosure portion 612 and the printed circuit board 614. Based upon this determination, the dynamic thermal adjustment system can dynamically configure thermal characteristics of the information handling system in which the base portion 600 is located.

FIG. 7 shows a table of example thermal characteristic selections for automated thermal property assignment based on surrounding part substrate. More specifically, the table includes two systems (e.g., Product 1 and Product 2, each of which have two substrate options (e.g., Metal and Plastic). Each row in the table (representing a particular system with a particular substrate option) includes a representation of a TDP value (e.g., 15 w, 17.52, 16.5 w and 17.5 w) for that particular system with the particular substrate option as well as a corresponding thermal table option (e.g., #1, #2, #3 and #4) for that particular system with the particular substrate option. In certain embodiments, each thermal table option refers to a respective set of thermal characteristic values.

FIG. 8 shows a table of example thermal characteristic selections for automated thermal property assignment based on surrounding part substrate material as well as additional system variables. More specifically, the table includes three systems (e.g., Product 1, Product 2 and Product 3), each of which have two substrate options (e.g., Metal and Plastic). Each column in the table (representing a particular system with a particular substrate option) includes a representation of a TDP value (e.g., 15 w, 17.52, 16.5 w and 17.5 w) for that particular system with the particular substrate option as well as additional system variables. In certain embodiments, the additional system variables include one or more of whether a particular product is configured as a 180 system or a 360 system and a base foot height of the particular product. In certain embodiments, one or more of these additional system variables are used when performing the automated thermal property assignment.

Figure 9:
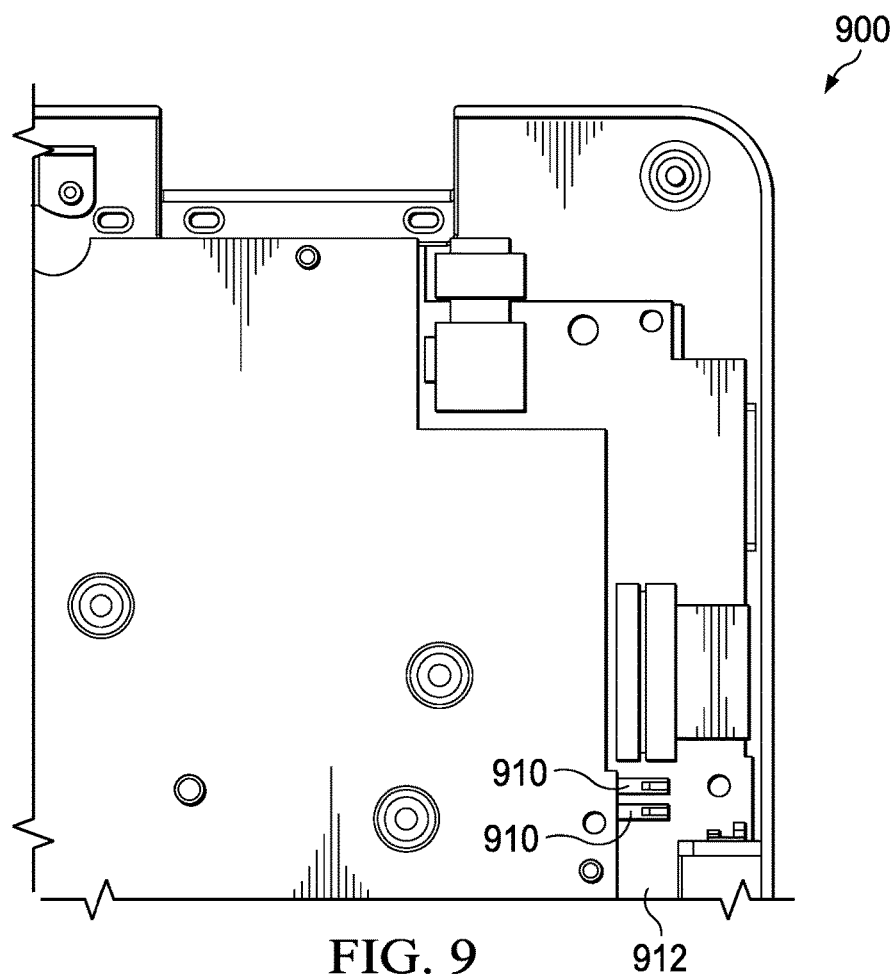
FIG. 9 shows a cutaway top view of a portion of a base chassis of a portable information handling system.

FIG. 9 shows a cutaway top view of a portion of a base chassis 900 of a portable information handling system. In certain embodiments, the base chassis 900 includes at least one electrically conductive device (e.g., spring 910) which is surface mounted to the printed circuit board 912 of the base chassis 900. When the C-cover is attached to the D-Cover of the base chassis, the electrically conductive device is compressed to be in physical and electrical contact with a portion of the C-Cover.

Figure 10:
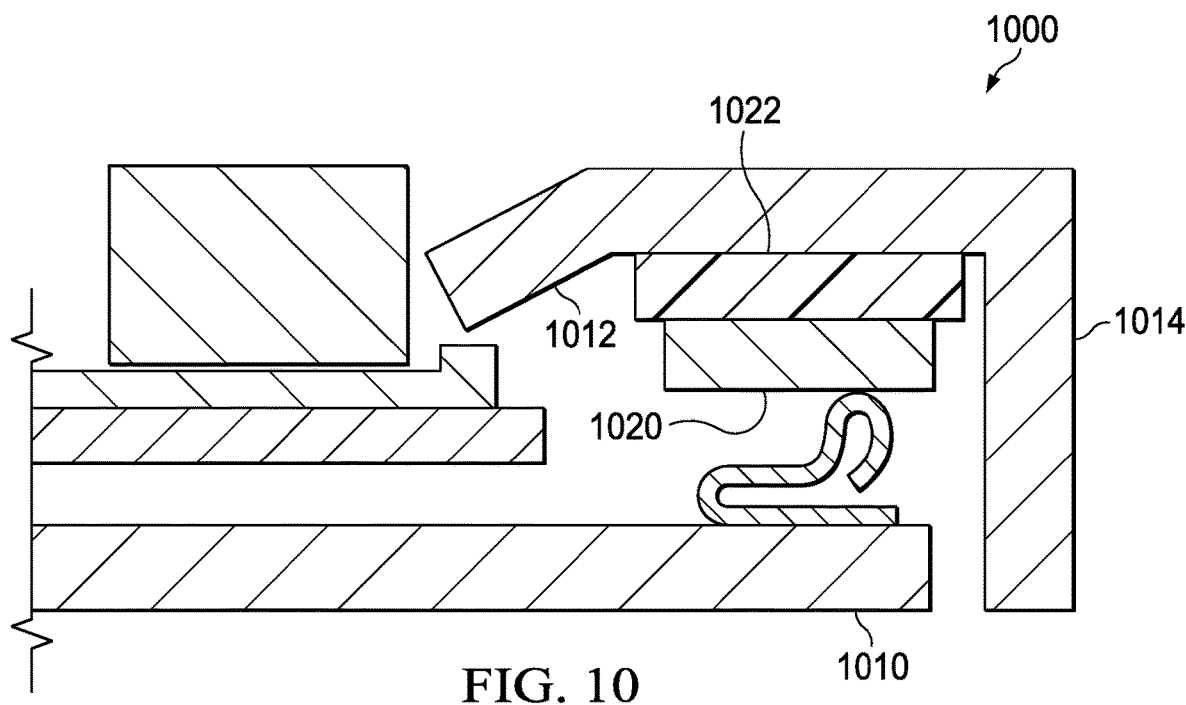
FIG. 10 shows a cross sectional view of a portion of a base chassis of a portable information handling system.

FIG. 10 shows a cross sectional view of a portion of a base chassis 1000 of a portable information handling system. In certain embodiments, the distance between the printed circuit board 1010 and the underside 1012 of a portion of the C-Cover 1014 is larger than can be reached by the electrically conductive device by itself. In this situation, additional electrically conductive material is attached to the underside 1012 of the portion of the C-Cover. In various embodiments, the electrically conductive material may include one or more of an aluminum foil portion 1020 and a mylar portion 1022. The addition of the additional electrically conductive material enables a conductive path to be established with the portion of the C-Cover when the C-Cover includes a substrate material which is electrically conductive.

Figure 11:
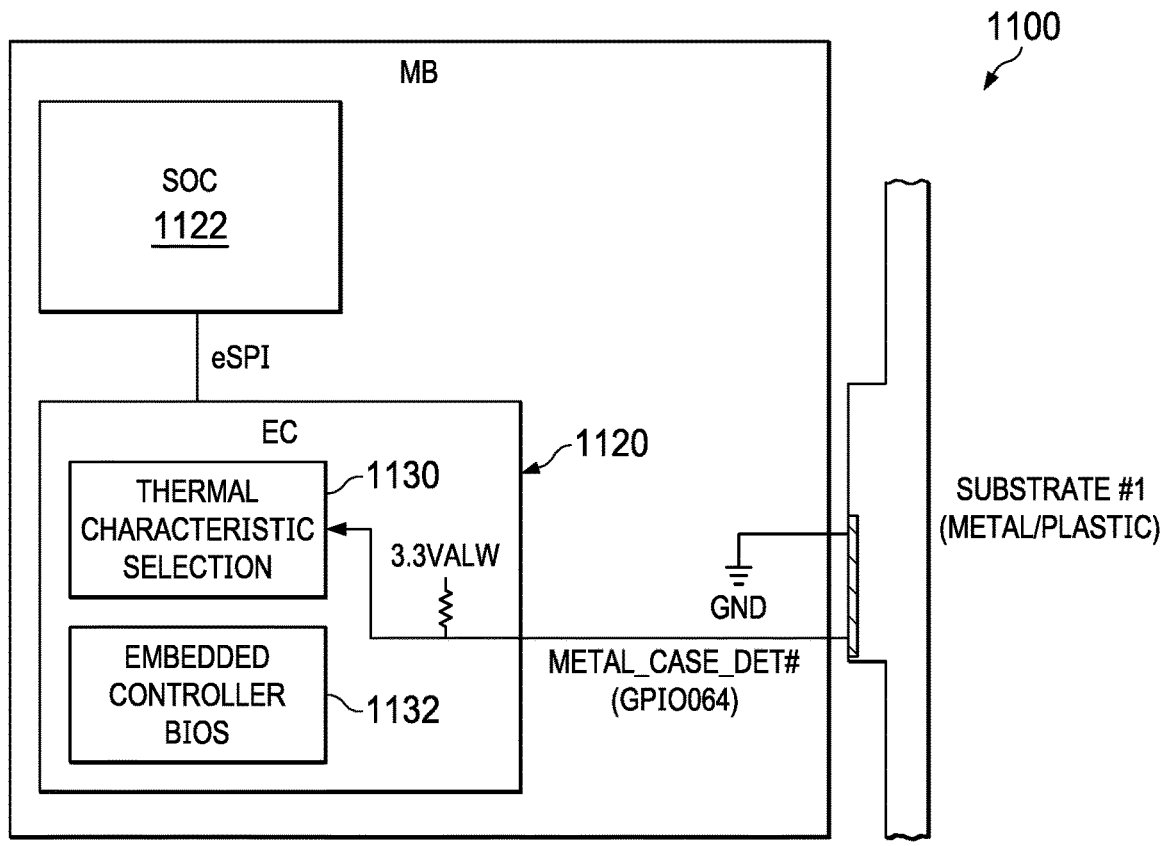
FIG. 11 shows a block diagram of a thermal characteristic selection system.

FIG. 11 shows a block diagram of a thermal characteristic selection system 1100. The thermal characteristic selection system 1100 includes an embedded controller 1120 as well as a system on a chip (SOC) 1122. In certain embodiments, the embedded controller includes a thermal characteristic selection component 1130 as well as an embedded controller basic input output system (BIOS) 1132. In certain embodiments, the embedded controller BIOS 1132 stores a plurality of sets of thermal characteristic values (e.g., thermal tables). In certain embodiments, the thermal characteristic selection component 1130 provides one of the plurality of sets of thermal characteristic values to the SOC 1122 based upon whether the substrate is electrically conductive or not. In certain embodiments, the sets of thermal characteristic values are stored within a thermal table. The thermal characteristic selection component 1130 makes the determination of whether the substrate is electrically conductive based upon the value of substrate material signal (METAL_CASE_DEC #). In certain embodiments, the substrate material signal is provided via the electrically conductive signal device (e.g., spring clip 416). In certain embodiments, the set of thermal characteristic values are provided to the SOC 1122 via an embedded serial port interface (eSPI).

In certain embodiments, the thermal characteristics are associated with an operating mode of the information handling system. In certain embodiments, the operating mode can include one or more of a balance mode of operation, a performance mode of operation, a cool mode of operation and a quiet mode of operation. In certain embodiments, the balance mode of operation is a default mode of operation. In certain embodiments, the thermal characteristic values include an indication of whether to turn a fan on or off and an indication of fan speed. In certain embodiments, the indication of fan speed can indicate a minimum fan speed, a low fan speed, a medium fan speed, a medium-high fan speed and a high fan speed. In certain embodiments, the minimum fan speed corresponds to a fan speed of 3000 revolutions per minute (RPM) (+/−10%), the low fan speed corresponds to a fan speed of 3300 revolutions per minute (RPM) (+/−10%), the medium fan speed corresponds to a fan speed of 4000 revolutions per minute (RPM) (+/−10%), the medium-high fan speed corresponds to a fan speed of 4600 revolutions per minute (RPM) (+/−10%) and the high fan speed corresponds to a fan speed of 5200 revolutions per minute (RPM) (+/−10%).

Figure 12:
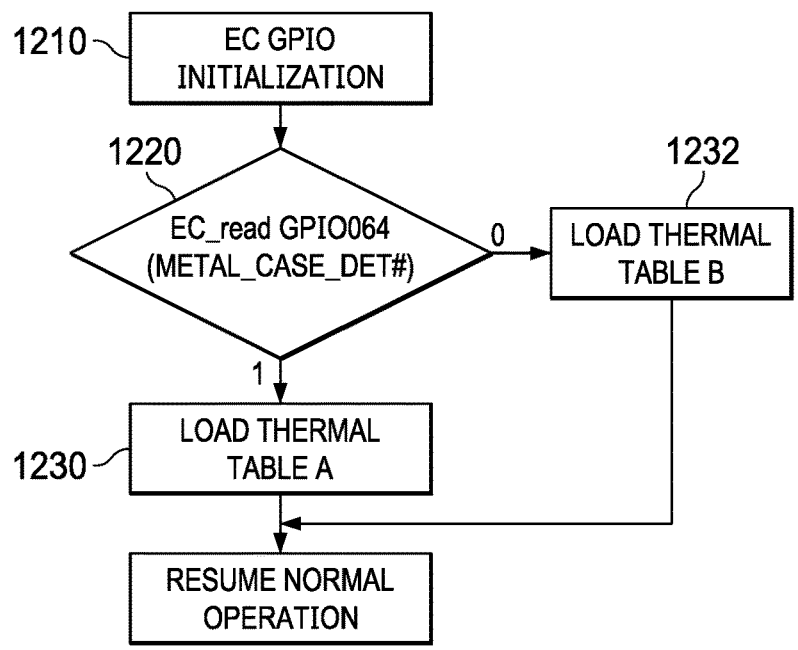
FIG. 12 shows a flow chart of a thermal characteristic selection operation.

FIG. 12 shows a flow chart of a thermal characteristic selection operation 1200. The thermal characteristic selection operation 1200 starts at step 1210 by initializing the embedded controller general purpose input/output (GPIO) portion of the embedded controller to access the substrate material signal. Next at step 1220, the embedded controller reads the substrate material signal. Based upon the value of the substrate material signal, the embedded controller accesses a thermal characteristic value repository and loads a set of thermal characteristic values (e.g., via step 1230 or step 1232) on the processor of the information handling system. In certain embodiments, the thermal characteristic value repository is stored within a BIOS of the embedded controller. In certain embodiments, the thermal characteristic value repository includes a thermal table. After the set of thermal characteristic values are loaded onto the processor (thus configuring the system for a particular thermal configuration), the system resumes normal operation.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A portable information handling system, comprising:
a main housing portion, the main housing portion comprising a first enclosure portion, a second enclosure portion, a motherboard, an electrical path detection component and a thermal characteristic selection system, the electrical path detection component being physically coupled between one of the first enclosure portion and the second enclosure portion and the motherboard, the thermal characteristic selection system determining a material of the one of the first enclosure portion and the second enclosure portion, the thermal characteristic selection system adjusting a thermal design power value based upon a particular configuration of the material, the particular configuration being one of a plurality of material configurations, the thermal design power value corresponding to a particular thermal wattage, the particular thermal wattage being associated with the particular configuration of the material; and,
a lid housing portion, the display chassis portion comprising a display component and a rear display cover portion; and wherein
the thermal characteristic selection system adjusts the thermal design power value based upon a value of a substrate material signal.

2. The portable information handing system of claim 1, wherein:
the main housing portion comprises a second electrical path detection component, the second electrical path detection component being physically coupled between another of the first enclosure portion and the second enclosure portion and the motherboard.

3. The portable information handing system of claim 2, wherein:
the first enclosure portion includes a first material and the second enclosure portion includes a second material.

4. The portable information handling system of claim 1, wherein:
the thermal characteristic selection system configures a set of thermal characteristics based upon the thermal design power value.

5. The portable information handling system of claim 4, wherein:
the set of thermal characteristics are configured according to a respective set of thermal characteristic values, the set of thermal characteristic values comprising an indication of whether to turn a fan on or off and an indication of fan speed.

6. The portable information handling system of claim 5, wherein:
the set of thermal characteristics are associated with an operating mode of the portable information handling system.

7. The portable information handing system of claim 1, wherein:
the substrate material signal is provided to the thermal characteristic selection system via the electrical path detection component.

8. The portable information handing system of claim 5, wherein:
the set of thermal characteristic values are provided to the thermal characteristic selection system via an embedded serial port interface.

9. The portable information handing system of claim 1, wherein:
the electrical path detection component comprises a spring clip.

10. The portable information handing system of claim 6, wherein:
the operating mode of the portable information handling system includes a balance mode of operation, a performance mode of operation, a cool mode of operation and a quiet mode of operation.

11. The portable information handing system of claim 10, wherein:
the balance mode of operation is a default mode of operation.

12. An information handling system comprising:
a base chassis, the base chassis comprising first enclosure portion, a second enclosure portion, a motherboard, an electrical path detection component and a thermal characteristic selection system, the electrical path detection component being physically coupled between one of the first enclosure portion and the second enclosure portion and the motherboard, the thermal characteristic selection system determining a material of the one of the first enclosure portion and the second enclosure portion, the thermal characteristic selection system adjusting a thermal design power value based upon a particular configuration of the material, the particular configuration being one of a plurality of material configurations, the thermal design power value corresponding to a particular thermal wattage, the particular thermal wattage being associated with the particular configuration of the material; and,
a display chassis, the display chassis comprising a display component and a rear display cover portion; and wherein
the thermal characteristic selection system adjusts the thermal design power value based upon a value of a substrate material signal.

13. The information handling system of claim 12, wherein:
the base chassis portion comprises a second electrical path detection component, the second electrical path detection component being physically coupled between another of the first enclosure portion and the second enclosure portion and the motherboard.

14. The information handling system of claim 13, wherein:
the first enclosure portion includes a first material and the second enclosure portion includes a second material.

15. The information handling system of claim 12, wherein:
the thermal characteristic selection system configures a set of thermal characteristics based upon the thermal design power value.

16. The information handling system of claim 15, wherein:
the set of thermal characteristics are configured according to a respective set of thermal characteristic values, the set of thermal characteristic values comprising an indication of whether to turn a fan on or off and an indication of fan speed.

17. The information handling system of claim 16, wherein:
the set of thermal characteristics are associated with an operating mode of the portable information handling system.

18. The information handing system of claim 12, wherein:
the substrate material signal is provided to the thermal characteristic selection system via the electrical path detection component.

19. The information handing system of claim 16, wherein:
the set of thermal characteristic values are provided to the thermal characteristic selection system via an embedded serial port interface.

20. The information handing system of claim 12, wherein:
the electrical path detection component comprises a spring clip.

21. The information handing system of claim 17, wherein:
the operating mode of the portable information handling system includes a balance mode of operation, a performance mode of operation, a cool mode of operation and a quiet mode of operation.

22. The information handing system of claim 21, wherein:
the balance mode of operation is a default mode of operation.

* * * * *